United States Patent
Shibib et al.

(10) Patent No.: US 10,693,288 B2
(45) Date of Patent: Jun. 23, 2020

(54) PROTECTION CIRCUITS WITH NEGATIVE GATE SWING CAPABILITY

(71) Applicant: Vishay-Siliconix, San Jose, CA (US)

(72) Inventors: Muhammed Ayman Shibib, San Jose, CA (US); Chungchi Gina Liao, Los Altos, CA (US)

(73) Assignee: Vishay Siliconix, LLC, San Jose, CA (US)

( * ) Notice: Subject to any disclaimer, the term of this patent is extended or adjusted under 35 U.S.C. 154(b) by 0 days.

(21) Appl. No.: 16/019,282

(22) Filed: Jun. 26, 2018

(65) Prior Publication Data

US 2019/0393693 A1 Dec. 26, 2019

(51) Int. Cl.
*H03K 17/56* (2006.01)
*H02H 3/02* (2006.01)
(Continued)

(52) U.S. Cl.
CPC ......... *H02H 3/023* (2013.01); *H01L 27/0266* (2013.01); *H01L 29/778* (2013.01);
(Continued)

(58) Field of Classification Search
CPC .... H02H 3/023; H02H 3/20; H03K 17/08122; H03K 17/6871; H01L 27/0266; H01L 29/778
(Continued)

(56) References Cited

U.S. PATENT DOCUMENTS 5,923,513 A * 7/1999 Pelly ................ H03K 17/08148
361/90
6,069,782 A * 5/2000 Lien .................... H01L 27/0248
361/111
(Continued)

FOREIGN PATENT DOCUMENTS

EP 2779246 A2 9/2014
KR 1020120020230 3/2012

OTHER PUBLICATIONS

Lee, Finella; The Effects of Gate Metals on the Performance of p-GaN/AlGaN/GaN High Electron Mobility Transistors; cMantech Conference; May 19, 2014; Denver Colorado, US.
(Continued)

*Primary Examiner* — Ryan Jager

(57) ABSTRACT

A protection circuit can include a first clamping sub-circuit, a first switching sub-circuit and a first resistive sub-circuit coupled in series between a first and second node. The protection circuit can also include a second clamping sub-circuit, a second switching sub-circuit and a second resistive sub-circuit coupled in series between the second and first nodes. The first and second clamping sub-circuits and the first and second resistive sub-circuits can be configured to bias a switching shunt sub-circuit. The switching shunt sub-circuit can be configured to short the first and second nodes together in response to a bias potential from the first and second clamping sub-circuits and the first and second resistive sub-circuits indicative of an over-voltage, Electro-
(Continued)

static Discharge (ESD) or similar event. The first and second switching sub-circuits can be configured to prevent the occurrence of a current path through the first and second resistive sub-circuits at the same time.

20 Claims, 3 Drawing Sheets

(51) Int. Cl.
*H01L 27/02* (2006.01)
*H01L 29/778* (2006.01)
*H02H 3/20* (2006.01)
*H03K 17/0812* (2006.01)
*H03K 17/687* (2006.01)

(52) U.S. Cl.
CPC ......... *H02H 3/20* (2013.01); *H03K 17/08122* (2013.01); *H03K 17/6871* (2013.01)

(58) Field of Classification Search
USPC ........................................................ 327/419
See application file for complete search history.

(56) References Cited

U.S. PATENT DOCUMENTS

| | | | |
|---|---|---|---|
| 6,411,485 B1 * | 6/2002 | Chen | H01L 27/0255 361/111 |
| 7,544,545 B2 | 6/2009 | Chen et al. | |
| 7,583,485 B1 | 9/2009 | Luo et al. | |
| 7,642,164 B1 | 1/2010 | Xu et al. | |
| 7,781,894 B2 | 8/2010 | Oikawa | |
| 7,816,764 B2 | 10/2010 | Marchand et al. | |
| 7,851,825 B2 | 12/2010 | Suh et al. | |
| 7,898,004 B2 | 3/2011 | Wu et al. | |
| 7,985,986 B2 | 7/2011 | Heikman et al. | |
| 8,039,352 B2 | 10/2011 | Mishra et al. | |
| 8,049,252 B2 | 11/2011 | Smith et al. | |
| 8,114,717 B2 | 2/2012 | Palacios et al. | |
| 8,269,019 B2 | 9/2012 | Heiser et al. | |
| 8,367,500 B1 | 2/2013 | Xu et al. | |
| 8,390,027 B2 | 3/2013 | Iwamuro | |
| 8,582,258 B1 | 11/2013 | Luo et al. | |
| 9,083,175 B2 * | 7/2015 | Rouet | H04L 25/06 |
| 9,111,754 B2 | 8/2015 | Demirlioglu et al. | |
| 9,142,543 B2 * | 9/2015 | Katakura | H01L 27/0274 |
| 9,331,472 B2 * | 5/2016 | Huang | H02H 9/046 |
| 9,941,267 B2 * | 4/2018 | Tsai | H01L 27/0266 |
| 2003/0108659 A1 | 6/2003 | Bales et al. | |
| 2003/0128486 A1 * | 7/2003 | Chuang | H01L 27/0277 361/56 |
| 2004/0257728 A1 * | 12/2004 | Hu | H01L 27/0266 361/56 |
| 2008/0062595 A1 * | 3/2008 | Ping | H01L 27/0266 361/56 |
| 2008/0142837 A1 | 6/2008 | Sato et al. | |
| 2009/0065785 A1 | 3/2009 | Beach | |
| 2009/0140295 A1 | 6/2009 | Kaya et al. | |
| 2009/0166677 A1 | 7/2009 | Shibata et al. | |
| 2011/0026176 A1 | 2/2011 | Kim | |
| 2011/0210337 A1 | 9/2011 | Briere | |
| 2012/0007049 A1 | 1/2012 | Jeon et al. | |
| 2012/0043586 A1 | 2/2012 | Nishimori et al. | |
| 2012/0080724 A1 | 4/2012 | Iwabuchi et al. | |
| 2013/0088280 A1 | 4/2013 | Lal et al. | |
| 2013/0153919 A1 | 6/2013 | Curatola et al. | |
| 2014/0264453 A1 | 9/2014 | Moens et al. | |
| 2014/0327043 A1 | 11/2014 | Kim | |
| 2015/0069615 A1 | 3/2015 | Ohno et al. | |
| 2016/0372920 A1 * | 12/2016 | Kinzer | H02H 9/046 |
| 2017/0256938 A1 | 9/2017 | Fukuhara | |
| 2017/0357283 A1 | 12/2017 | Adachi | |
| 2018/0026029 A1 * | 1/2018 | Lin | H01L 27/0266 361/56 |
| 2018/0047719 A1 | 2/2018 | Vielemeyer et al. | |

OTHER PUBLICATIONS

Meneghini, Matteo; Technology and Reliability of Normally-Off GaN HEMTs with p-Type Gate; Energies, MDPI Journal; Jan. 24, 2017; Basel, CH.

Wuerfl et al., "Reliability issues of Gan based high voltage power devices", Microelectronics and Reliability, Elsevier Science LTD., vol. 51, No. 9, Jul. 5, 2011, Berlin, Germany.

Hsien-Chin Chiu et al., A high Protection Voltage Dual-Gate GaN HEMT Clamp for Electric Vehicle Application, 2011, IEEE.

Zhixin Wang et al., Development of an Electrostatic Discharge Protection Solution in GaN Technology, Dec. 2013, IEEE Electron Device Letter, vol. 34, No. 12, pp. 1491-1493.

Qiang Cui et al., Development of a New pHMET-Based Electrostatic Discharge Protection Structure, Sep. 2011, IEEE Transactions on Electron Devices, vol. 58, No. 9, pp. 2974-2980.

* cited by examiner

PROTECTION CIRCUITS WITH NEGATIVE GATE SWING CAPABILITY

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing devices and other electronics are switching devices that can turn on and off fast, pass large currents with relatively low on resistance, and/or have large breakdown voltages. Switching device that can turn on and off fast, pass large currents with relatively low on resistance, and/or have large breakdown voltages are commonly used in voltage converter, high-frequency transmitters and receivers, or the like in numerous electronic devices.

An exemplary switching device that can turn on and off fast, pass large currents with relatively low on resistance, and/or have large breakdown voltages is the High Electron Mobility Transistor (HEMT), also known as a Heterostructure Field Effect Transistor (HFET) or Modulation Doped Field Effect Transistor (MODFET). Enhancement HEMTs turn on and conduct between their drain and source terminals in response to a positive voltage between their gate and source terminals. The enhancement HEMTs typically turn off in response to a small negative voltage between their gate and source terminals. The HEMT can also be readily damaged by high voltages as the result of over-voltage events, Electrostatic Discharge (ESD) events and the like. Accordingly, there is a need for protection circuits for use with the HEMTs and other similar devices that do not affect the switching operation of the devices.

SUMMARY OF THE INVENTION

The present technology may best be understood by referring to the following description and accompanying drawings that are used to illustrate embodiments of the present technology directed toward circuits for protecting against over-voltage, Electrostatic Discharge (ESD) and other similar events.

In one embodiment, a circuit can include a switching shunt sub-circuit, a first and second clamping sub-circuit, a first and second switching sub-circuit, and a first and second resistive sub-circuit. The switching shunt sub-circuit can be coupled between a first and second node. The first switching sub-circuit and the first resistive sub-circuit can be coupled in series. The first switching sub-circuit can be configured to couple the first resistive element to the first clamping sub-circuit when a potential at the first node is above the potential of the second node, wherein a third node is biased at a first given potential drop below the potential on the first node by the first clamping sub-circuit when the potential at the first node is above the potential at the second node. Similarly, the second switching element and the second resistive element can be coupled in series. The second switching sub-circuit can be configured to couple the second resistive element to the second clamping sub-circuit when the potential at the second node is above the potential of the first node, wherein the third node is biased at a second given potential drop below the potential on the second node by the second clamping sub-circuit when the potential at the second node is above the potential of the first node. The switching shunt sub-circuit can be configured to short the first and second nodes together when a potential at a third node raises above a predetermined level.

In another embodiment, a circuit can include a shunt transistor, a first and second series of one or more clamping elements, a first and second switching transistor, and a first and second resistive element. The shunt transistor can include a drain coupled to a first node, a source coupled to a second node and a gate coupled to a third node. The first series of one or more clamping elements, the first switching transistor and the first resistive element can be coupled in series. The first series of one or more clamping elements can be coupled in series between the first node and the third node. The first switching transistor can include a drain coupled to the third node and a gate coupled along the first series of one or more clamping elements not including the third node. The first resistive element can be coupled between a source of the first switching transistor and the second node. The second series of one or more clamping elements, the second switching transistor and the second resistive element can be coupled in series. The second series of one or more clamping elements can be coupled in series between the second node and the third node. The second switching transistor can include a drain coupled to the third node and a gate coupled along the second series of one or more clamping elements not including the third node. The second resistive element can be coupled between a source of the second switching transistor and first node. In one aspect, the gate of the first switching transistor can be coupled to the first node, and the gate of the second switching transistor can be coupled to the second node. In another aspect, the gate of the first switching transistor can be coupled between a pair of clamping element of the first series, and the gate of the second switching transistor can be coupled between a pair of clamping elements of the second series.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1:
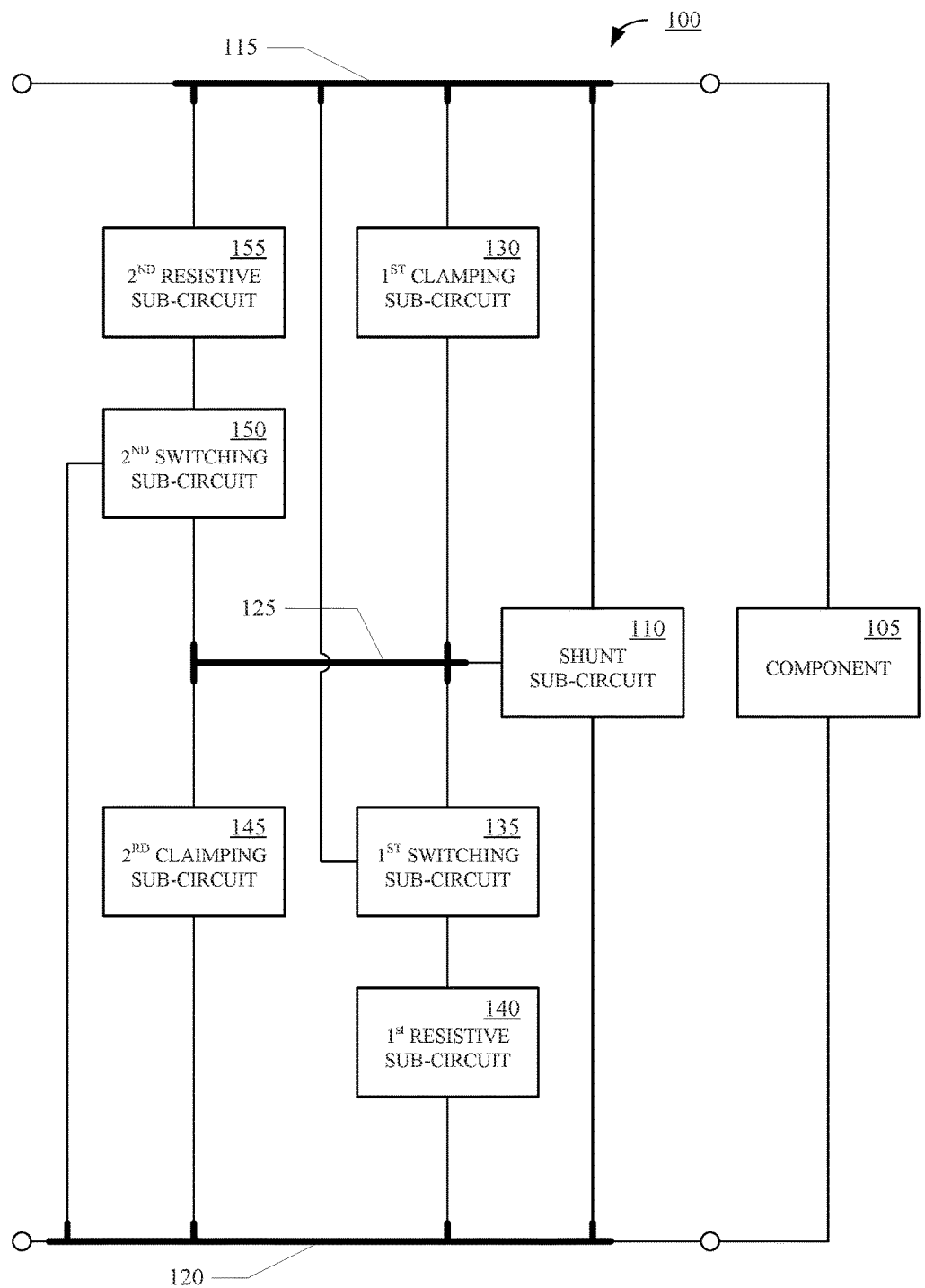
FIG. 1 shows a circuit, in accordance with aspects of the present technology.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

FIG. 1 shows a circuit, in accordance with aspects of the present technology. The circuit 100 can be employed to protect a component 105 against an over-voltage event, an Electrostatic Discharge (ESD) event, or other similar events. The circuit 100 can include a switching shunt sub-circuit 110 coupled between a first node 115 and second node 120. A control input of the switching shunt sub-circuit 110 can be coupled to a third node 125. A first clamping sub-circuit 130 can be coupled between the first node 115 and the third node 125. A first switching sub-circuit 135 and a first resistive sub-circuit 140 can be coupled in series between the third node 125 and the second node 120. A control input of the first switching sub-circuit 135 can be coupled to the first node 115. The circuit 100 can also include a second clamping sub-circuit 145 coupled between the second node 120 and the third node 125. A second switching sub-circuit 150 and a second resistive sub-circuit 155 can be coupled in series between the third node 125 and the first node 115. A control input of the second switching sub-circuit 150 can be coupled to the second node 120.

When the potential at the first node 115 raises above the potential of the second node 120, the first switching sub-circuit 135 can be configured to turn on and couple the first resistive sub-circuit 140 to the third node 125 before the clamping sub-circuit 130 turns on and clamps the third node 125 at a clamping potential below the potential of the first node 115. When the potential at the second node 120 raises above the potential of the first node 115 (e.g., the first node 115 swings negative relative to the second node 120), the second switching sub-circuit 150 can be configured to turn on and couple the second resistive sub-circuit 155 to the third node 125 before the second clamping sub-circuit 145 turns on and clamps the third node 125 at a clamping potential below the potential of the second node 120. The first and second sub-circuits 135, 150 can be configured to actively steer current through either the first resistive sub-circuit 140 or the second resistive sub-circuit 155, respectively, and prevent a current path through both the first and second resistive sub-circuits 140, 155 at the same time. When the potential at the third node 125 raises above the potential at the first or second node 115, 120 by an on-voltage of the switching shunt sub-circuit 110, the switching shunt sub-circuit 110 can turn on and provide a conductive path that effectively shorts the first and second nodes 115, 120. Accordingly, circuit 100 can protect the component 105 against positive and negative over-voltage events, ESD events, and the like.

In one implementation, the component 105 can be an enhancement High Electron Mobility Transistor (HEMT). The enhancement HEMT can turn on in response to a positive potential applied between a gate and a source of the HEMT. The enhancement HEMT can turn off in response to a negative potential applied between its gate and source. However, the HEMT can be damaged by an over-voltage event, an ESD event or the like at its gate. The turn-on potential of the HEMT can be less than the sum of the clamping voltage of the first clamping sub-circuit 130 and the turn-on voltage of the switching shunt sub-circuit 110. Similarly, the turn-off potential of the HEMT can be less than the sum of the clamping voltage of the second clamping sub-circuit 145 and the turn-on voltage of the switching shunt sub-circuit 110. Therefore, the circuit 100 can provide the turn-on and turn-off voltages for proper operation of the HEMT device, and also protect the HEMT device against over-voltage events, ESD events or the like.

Figure 2:
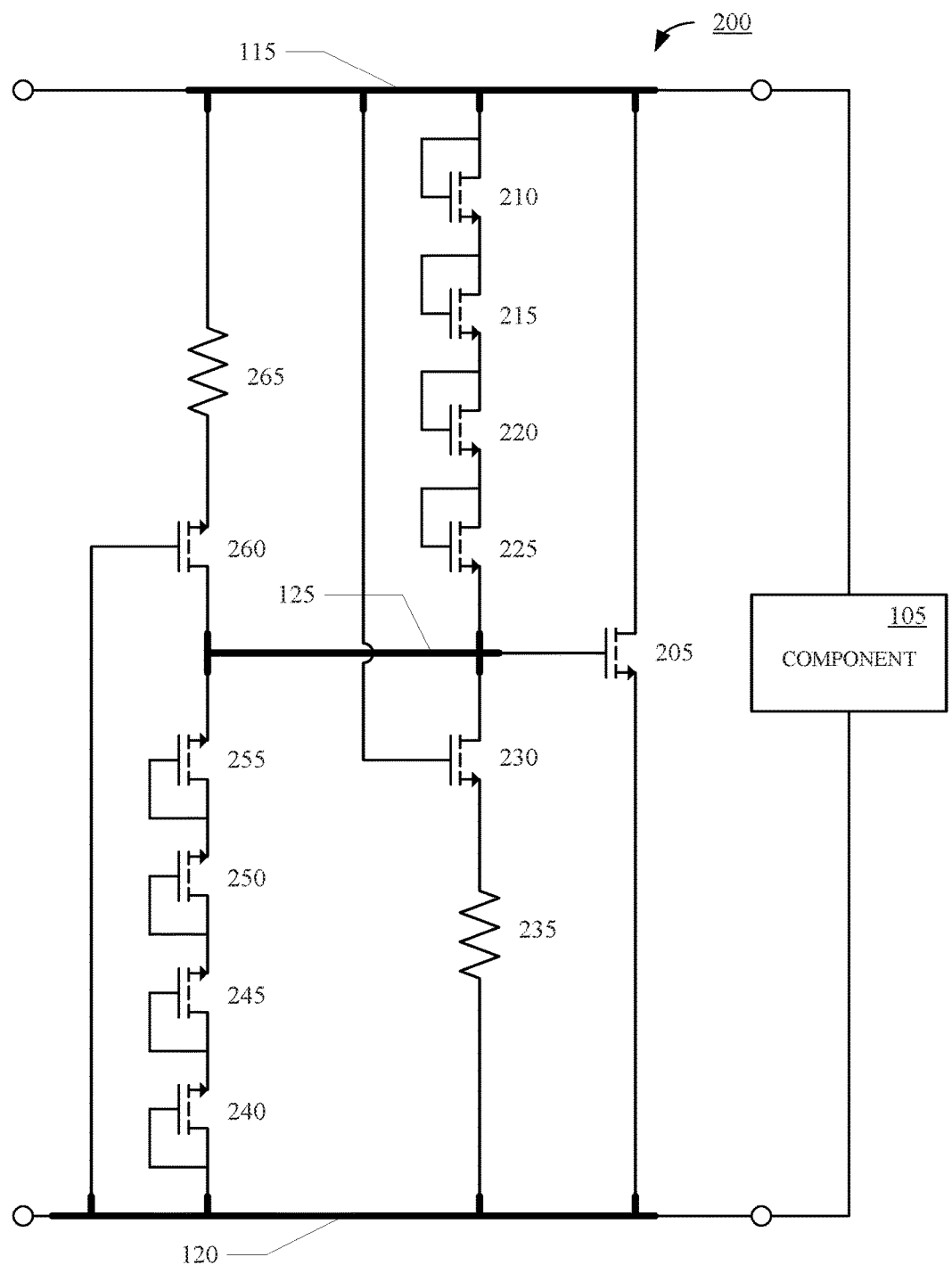
FIG. 2 shows a circuit, in accordance with aspects of the present technology.

Referring now to FIG. 2, a circuit, in accordance with aspects of the present technology, is shown. The circuit 200 can be employed to protect a component 105 against an over-voltage event, an Electrostatic Discharge (ESD) event, or other similar events. The circuit 200 can include a switching shunt transistor 205 coupled between a first node 115 and a second node 120. A control input of the switching shunt transistor 205 can be coupled to a third node 125. A first series of one or more clamping elements 210-225 can be coupled between the first node 115 and the third node 125. A first switching transistor 230 and a first resistive element 235 can be coupled between the third node 125 and the second node 120. A control input of the first switching transistor 230 can be coupled to the first node 115. The circuit 200 can also include a second series of one or more clamping transistors 240-255 coupled between the second node 120 and the third node 125. A second switching transistor 260 and a second resistive element 265 can be coupled in series between the third node 125 and the first node 115. A control input of the second switching transistor 260 can be coupled to the second node 120. In one implementation, the one or more clamping elements 210-225, 240-255 can be one or more diode elements coupled in series, or one or more diode-coupled transistors coupled in series.

As the potential at the first node 115 begins to raise above the potential of the second node 120, the first switching transistor 230 can turn on before the first series of clamping elements 210-225 turn on, and the first resistive element 235 can pull the potential at the third node 125 down to the potential at the second node 120. Once the potential of the first node 115 raises above the potential at the second node 120 by more than the sum of clamping potentials of the first series of clamping elements 210-225, the first series of clamping elements 210-225 can turn on and clamp a potential at the third node 125 at a level substantially equal to the sum of the clamping potentials of the first series of one or more clamping elements 210-225 below the potential of the first node 115. As the potential of the first node 115 continues to raise above the potential at the second node 120, the potential at the third node 125 can raise above the potential of the second node 120 due to current flowing through the first resistive element 235. When the potential at the third node 125 raises above the potential at the second node 120 by a threshold voltage of the switching shunt transistor 205, the switching shunt transistor 205 can turn on and provide a conductive path that effectively shorts the first node 115 to the second node 120. Accordingly, the first switching transistor 230 can turn on before the first plurality of clamping transistors 210-225 turn on, as the potential of the first node 115 raises above the potential of the second node 120. In addition, the first switching transistor 230 prevents the direct connection of the first resistive element 235 to the gate of the switching shunt transistor 205.

As the potential at the second node 120 begins to raise above the potential of the first node 115 by a threshold voltage of the second switching transistor 260, the second switching transistor 260 can turn on and the second resistive element 265 can pull the potential at the third node 125 down to the potential at the first node 115. Once the potential of the second node 120 raises above the potential at the first node 115 by more than the sum of the clamping potentials of the second series of clamping elements 240-255, the second series of clamping transistors 240-255 can turn on and clamp a potential at the third node 125 at a level substantially equal to the sum of the clamping potential of the second series of one or more clamping elements 240-255 below the potential of the second node 120. As the potential of the second node 120 continues to raise above the potential at the first node 115, the potential at the third node 125 will raise above the potential of the first node 115 due to current flowing through the second resistive element 265. When the potential at the third node 125 raises above the potential at the first node 115 by a threshold voltage of the switching shunt transistor 205, the switching shunt transistor 205 can turn on and provide a conductive path that effectively shorts the first node 115 to the second node 120. Accordingly, the potential between the first and second nodes 115, 120 can swing negative by approximately the sum of the clamping potentials of the second series of clamping elements 240-255 without the switching shunt transistor 205 turning on and shorting the first and second nodes 115, 120 together. In addition, the second switching transistor 260 can turn on before the second series of clamping elements 240-255 turn on, as the potential of the second node 120 raises above the potential of the first node 115. Furthermore, the second switching transistor 260 prevents the direct connection of the second resistive element 265 to the gate of the switching shunt transistor 205.

In one implementation, the component 105 can be a Gallium Nitride (GaN) based enhancement HEMT, including a gate coupled to the first node 115 and a source coupled to the second node 120. The enhancement HEMT component 105 can have a turn-on voltage of approximately 1.5 volts, and a turn-off voltage of approximately 10 volts. The switching shunt transistor 205 can be a Gallium Nitride (GaN) based enhancement HEMT. The enhancement HEMT shunt transistor 205 can have a turn-on voltage of approximately 1.5 volts, and a turn-off voltage of approximately 20 volts. The first and second series of clamping elements 210-225, 240-255 can be diode-coupled Gallium Nitride (GaN) based enhancement HEMTs, each with a turn on voltage of approximately 1.5 volts. The first and second switch transistor 230, 260 can be Gallium Nitride (GaN) based enhancement HEMTs having threshold voltages of approximately 1.5 volts. In one implementation, when the potential between the first and second node 115, 120 raises above a positive 1.5 volts, the first switching transistor 230 can turn on and couple the first resistive element 235 to the third node 125. However, the first series of clamping diode-coupled transistors 210-225 will not all be turned on. In addition, the second switching transistor 260 will also be turned off, preventing a current path through the second resistive element 265. As the potential between the first and second nodes 115, 120 continues to swing more positive, the clamping diode-coupled transistor 210-225 will successively turn on. If the circuit includes a series of four clamping diode-coupled transistor 210-225, each with a clamping voltage of approximately 1.5 volts, and the threshold voltage of the enhancement HEMT shunt transistor 205 is approximately 1.5 volts, the enhancement HEMT shunt transistor 205 can turn on when the potential between the first and second nodes 115, 120 exceeds 7.5 volts. Therefore, when the potential between the first and second nodes 115, 120 exceeds 7.5 volts (e.g., an over-voltage or ESD event), the enhancement HEMT shunt transistor 205 can short the first and second nodes 115, 120 together to protect the enhancement HEMT component 105 from damage.

When the potential between the first and second node 115, 120 swings below −1.5 volts, the second switching transistor 260 can turn on and couple the second resistive element 260 to the third node 125. However, the first series of clamping diode-coupled transistors 210-225 will not all be turned on. In addition, the first switching transistor 230 will also be turned off, preventing a current path through the first resistive element 235. As the potential between the first and second nodes 115, 120 continues to swing more negative, the clamping diode-coupled transistors 240-255 will successively turn on. If the circuit includes a series of four clamping diode-coupled transistor 240-255, each with a clamping voltage of approximately 1.5 volts, and the threshold voltage of the enhancement HEMT shunt transistor 205 is approximately 1.5 volts, the enhancement HEMT shunt transistor 205 can turn on when the potential between the first and second nodes 115, 120 is below −7.5 volts. Therefore, when the potential between the first and second nodes 115, 120 goes below −7.5 (e.g., an over-voltage or ESI) event), the enhancement HEMT shunt transistor 205 can short the first and second nodes 115, 120 together to protect the enhancement HEMT component 105 from damage.

Although FIG. 2 illustrates four clamping elements in the first and second series of clamping elements 210-225, 240-255, the circuit 200 can include more or less clamping elements. Furthermore, the first and second series of clamping elements 210-225, 240-255 can have the same number of clamping elements, or different numbers of clamping elements. The number of clamping elements in the first and second series of clamping elements 210-225, 240-225 can be selected to configure the potentials between which the first and second switching transistor 230, 260 turn on before a current path through the respective first and second series of clamping element 210-225, 240-255 turns on. In addition or in the alternative, the number of clamping elements in the first and second series of clamping elements 210-225, 240-225 can be selected to configure the potentials at which the switching shunt transistor 205 turns on and shunts current past the component 105 to be protected from over-voltage events, ESD events or the like.

In one implementation, the circuit 200 can be fabricated from discrete components. In another implementation, the circuit 200 can be fabricated as a monolithic Integrated Circuit (IC), with the IC circuit 200 coupled to the separate component 105. In another implementation, the circuit 200 and the component 105 can be fabricated in a single monolithic Integrated Circuit (IC).

In one implementation, the circuit 200 can have a negative potential swing on the first and second nodes 110, 115 to turn off the component 105, without triggering the switching shunt transistor 205 to short the first and second nodes 110, 115 together. However, the switching shunt transistor 205 can turn on and provide a conductive path that can short the first node 110 to the second node 115 to protect the component 105 against positive and negative over-voltage events, positive and negative ESD events, and other similar events. Furthermore, the first and second switching transistors 230, 260, that prevent the direct connection of the first and second resistive elements 235, 265 to the gate of the switching shunt transistor 205, advantageously prevents the switching shunt transistor 205 from conduct in case there is a negative gate swing at the switching shunt transistor 205. Any conduction during a negative gate swing would cause a loss in the power efficiency of the circuit 200.

Figure 3:
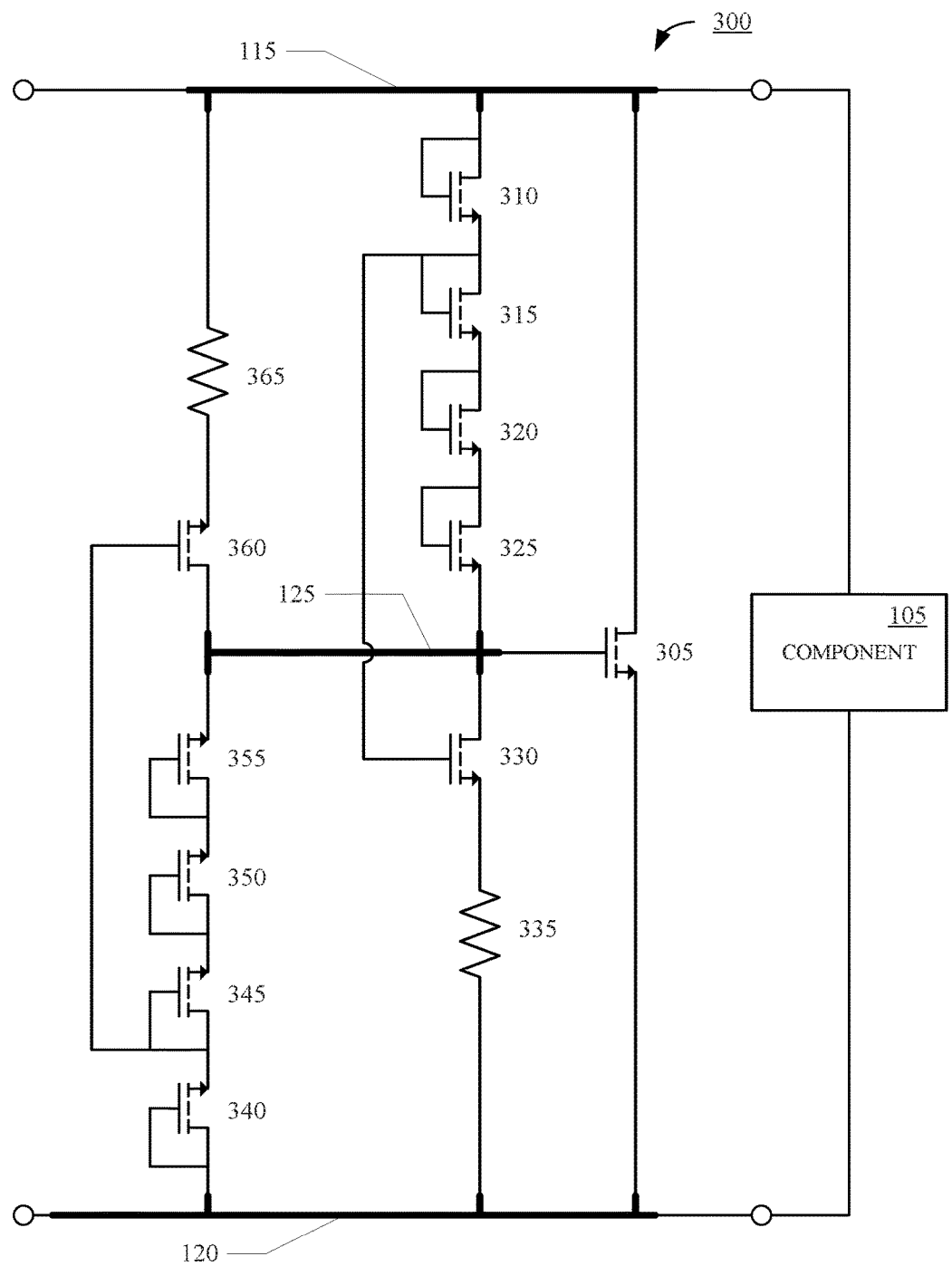
FIG. 3 shows a circuit, in accordance with aspects of the present technology.

Referring now to FIG. 3 a circuit, in accordance with aspects of the present technology. The circuit 300 can be employed to protect a component 105 against an over-voltage event, an Electrostatic Discharge (ESD) event, or other similar events. The circuit 300 can include a switching shunt transistor 305 coupled between a first node 115 and a second node 120. A control input of the switching shunt transistor 305 can be coupled to a third node 125. A first series of clamping elements 310-325 can be coupled between the first node 115 and the third node 125. A first switching element 330 and a first resistive element 335 can be coupled between the third node 125 and the second node 120. A control input of the first switching transistor 330 can be coupled between a first clamping element and a second clamping element of the first series of clamping elements 310-325. Although FIG. 3 illustrates that the control input of the first switching transistor 330 is coupled between clamping elements 310 and 315, the control input of the first switching transistor 330 can be coupled between any other pair of clamping elements. The circuit 300 can also include a second series of clamping elements 340-355 coupled in series between the second node 120 and the third node 125. A second switching transistor 360 and a second resistive element 365 can be coupled in series between the third node 125 and the first node 115. A control input of the second switching transistor 360 can be coupled between a first clamping element and a second clamping element of the second series of clamping elements 340-355. Although FIG. 3 illustrates that the control input of the second switching transistor 360 is coupled between clamping elements 340 and 345, the control input of the second switching transistor 360 can be coupled between any other pair of clamping elements.

As the potential at the first node 115 begins to raise above the potential of the second node 120, the first switching transistor 330 can turn on before the first series of clamping elements 310-325 turn on, and the first resistive element 335 can pull the potential at the third node 125 down to the potential at the second node 120. Once the potential of the first node 115 raises above the potential at the second node 120 by more than the sum of clamping potentials of the first series of clamping elements 310-325, the first series of clamping elements 310-325 can turn on and clamp a potential at the third node 125 at a level substantially equal to the sum of the clamping potentials of the first series of one or more clamping elements 310-325 below the potential of the first node 115. As the potential of the first node 115 continues to raise above the potential at the second node 120, the potential at the third node 125 can raise above the potential of the second node 120 due to current flowing through the first resistive element 335. When the potential at the third node 125 raises above the potential at the second node 120 by a threshold voltage of the switching shunt transistor 305, the switching shunt transistor 305 can turn on and provide a conductive path that effectively shorts the first node 115 to the second node 120. Accordingly, the first switching transistor 330 can turn on before the first plurality of clamping transistors 310-325 turn on, as the potential of the first node 115 raises above the potential of the second node 120. In addition, the first switching transistor 330 prevents the direct connection of the first resistive element 335 to the gate of the switching shunt transistor 305.

As the potential at the second node 120 begins to raise above the potential of the first node 115, the second switching transistor 360 can turn on and the second resistive element 365 can pull the potential at the third node 125 down to the potential at the first node 115. Once the potential of the second node 120 raises above the potential at the first node 115 by more than the sum of the clamping potentials of the second series of clamping elements 340-355, the second series of clamping transistors 340-355 can turn on and clamp a potential at the third node 125 at a level substantially equal to the sum of the clamping potential of the second series of one or more clamping elements 340-355 below the potential of the second node 120. As the potential of the second node 120 continues to raise above the potential at the first node 115, the potential at the third node 125 will raise above the potential of the first node 115 due to current flowing through the second resistive element 365. When the potential at the third node 125 raises above the potential at the first node 115 by a threshold voltage of the switching shunt transistor 305, the switching shunt transistor 305 can turn on and provide a conductive path that effectively shorts the first node 115 to the second node 120. Accordingly, the potential between the first and second nodes 115, 120 can swing negative by approximately the sum of the clamping potentials of the second series of clamping elements 340-355 without the switching shunt transistor 305 turning on and shorting the first and second nodes 115, 120 together. In addition, the second switching transistor 360 can turn on before the second series of clamping elements 340-355 turn on, as the potential of the second node 120 raises above the potential of the first node 115. Furthermore, the second switching transistor 360 prevents the direct connection of the second resistive element 365 to the gate of the switching shunt transistor 305.

In one implementation, the component 105 can be a Gallium Nitride (GaN) based enhancement HEMT, including a gate coupled to the first node 115 and a source coupled to the second node 120. The enhancement HEMT component 105 can have a turn-on voltage of approximately 1.5, and a turn-off voltage of approximately 20. The switching shunt transistor 305 can be a Gallium Nitride (GaN) based enhancement HEMT. The enhancement HEMT shunt transistor 305 can have a turn-on voltage of approximately 1.5 volts, and a turn-off voltage of approximately 20 volts. The first and second series of clamping elements 310-325, 340-355 can be diode-coupled Gallium Nitride (GaN) based enhancement HEMTs, each with a turn on voltage of approximately 1.5 volts. The first and second switch transistors 330, 360 can be Gallium Nitride (GaN) based enhancement HEMTs having threshold voltages of approximately 1.5 volts. In one implementation, when the potential between the first and second node 115, 120 raises above a positive 3.0 volts, the first clamping element 310 and the first switching transistor 330 can turn on, wherein the first switching transistor 330 couples the first resistive element 335 to the third node 125. However, the first series of clamping diode-coupled transistors 310-325 will not all be turned on. In addition, the second switching transistor 360 will also be turned off, preventing a current path through the second resistive element 365. As the potential between the first and second nodes 115, 120 continues to swing more positive, the clamping diode-coupled transistor 310-325 will successively turn on. If the circuit includes a series of four clamping diode-coupled transistor 310-325, each with a clamping voltage of approximately 1.5 volts, and the threshold voltage of the enhancement HEMT shunt transistor 305 is approximately 1.5 volts, the enhancement HEMT shunt transistor 305 can turn on when the potential between the first and second nodes 115, 120 exceeds 7.5 volts. Therefore, when the potential between the first and second nodes 115, 120 exceeds 7.5 volts (e.g., an over-voltage or ESD event), the enhancement HEMT shunt transistor 305 can short the first and second nodes 115, 120 together to protect the component 105 from damage.

When the potential between the first and second node 115, 120 swings below −3.0 volts, the first clamping element 340 and the second switching transistor 360 can turn on, wherein the second switching transistor 360 couples the second resistive element 360 to the third node 125. However, the first series of clamping diode-coupled transistors 310-325 will not all be turned on. In addition, the first switching transistor 330 will also be turned off, preventing a current path through the first resistive element 335. As the potential between the first and second nodes 115, 120 continues to swing more negative, the clamping diode-coupled transistors 340-355 will successively turn on. If the circuit includes a series of four clamping diode-coupled transistor 340-355, each with a clamping voltage of approximately 1.5 volts, and the threshold voltage of the enhancement HEMT shunt transistor 305 is approximately 1.5 volts, the enhancement HEMT shunt transistor 305 can turn on when the potential between the first and second nodes 115, 120 is below −7.5 volts. Therefore, when the potential between the first and second nodes 115, 120 goes below −7.5 volts (e.g., an over-voltage or ESD event), the enhancement HEMT shunt transistor 305 can short the first and second nodes 115, 120 together to protect the enhancement HEMT component 105 from damage.

Although FIG. 3 illustrates four clamping elements in the first and second series of clamping elements 310-325, 340-355, the circuit 300 can include more or less clamping elements. Furthermore, the first and second series of clamping elements 310-325, 340-355 can have the same number of clamping elements, or different numbers of clamping elements. The number of clamping elements in the first and second series of clamping elements 310-325, 340-325 can be selected to configure the potentials between which the first and second switching transistor 330, 360 turn on before a current path through the respective first and second series of clamping element 310-325, 340-355 turns on. In addition or in the alternative, the number of clamping elements in the first and second series of clamping elements 310-325, 340-325 can be selected to configure the potentials at which the switching shunt transistor 305 turns on and shunts current past the component 105 to be protected from over-voltage events, ESD events or the like. The control input of the first and second switching transistor 330, 360 can be coupled between a selected pair of respective clamping element 310-325, 340-355 to adjust the potential at which the first and second switching transistors 330, 360 turn on. For example, if the control input of the first switching transistor 330 is coupled between the first and second clamping elements 310, 315, the first switching element will turn on after the potential between the first and second nodes 115, 120 exceeds approximately 1.5 volts. If the control input of the first switching transistor 330 is coupled between the second and third clamping elements 315, 320, the first switching element will turn on after the potential between the first and second nodes 115, 120 exceeds approximately 3 volts.

In one implementation, the circuit 300 can be fabricated from discrete components. In another implementation, the circuit 300 can be fabricated as a monolithic Integrated Circuit (IC), with the IC circuit 300 coupled to the separate component 105. In another implementation, the circuit 300 and the component 105 can be fabricated in a single monolithic Integrated Circuit (IC).

In one implementation, the circuit 300 can have a negative potential swing on the first and second nodes 110, 115 to turn off the component 105, without triggering the switching shunt transistor 305 to short the first and second nodes 110, 115 together. However, the switching shunt transistor 305 can turn on and provide a conductive path that can short the first node 110 to the second node 115 to protect the component 105 against positive and negative over-voltage events, positive and negative ESI) events, and other similar events. Furthermore, the first and second switching transistors 330, 360, that prevent the direction connection of the first and second resistive elements 335, 365 to the gate of the switching shunt transistor 305, advantageously prevents the switching shunt transistor 305 from conduct in case there is a negative gate swing at the switching shunt transistor 305. Any conduction during a negative gate swing would cause a loss in the power efficiency of the circuit 300.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A circuit comprising;
a shunt coupled between a potential voltage, wherein the shunt includes a shunt transistor including a drain coupled to a first node, a source coupled to a second node and a gate coupled to a third node, and wherein the potential voltage is coupled between the first and second nodes;
a positive over potential detection circuit configured to control the shunt to short the potential voltage when the potential voltage is greater than a predetermined positive level, wherein the positive over potential detection circuit includes a first series of one or more clamping elements, a first switching transistor and a first resistive element coupled in series, wherein the first series of one or more clamping elements are coupled in series between the first node and the third node, wherein the first switching transistor includes a drain coupled to the third node and a gate coupled along the first series of one or more clamping elements not including the third node, and wherein the first resistive element is coupled between a source of the first switching transistor and the second node; and
a negative over potential detection circuit configured to control the shunt to short the potential voltage when the potential voltage is less than a predetermined negative level, wherein the negative over the potential detection circuit includes a second series of one or more clamping elements, a second switching transistor and a second resistive element coupled in series, wherein the second series of one or more clamping elements are coupled in series between the second node and the third node, wherein the second switching included a drain coupled to the third node and a gate coupled along the second series of one or more clamping elements not including the third node, and wherein the second resistive element is coupled between a source of the second switching transistor and first node.

2. The circuit of claim 1, wherein:
the first series of one or more clamping elements comprises one or more diode-coupled transistors coupled in series between the first and third nodes; and
the second series of one or more clamping elements comprises one or more diode-coupled transistors coupled in series between the second and third nodes.

3. The circuit of claim 2, wherein the first and second series of one or more diode-coupled transistors comprise first and second series of one or more diode-coupled High Electron Mobility Transistors (HEMTs).

4. The circuit of claim 3, wherein the first and second series of one or more diode-coupled HEMTs comprise first and second series of one or more diode-coupled Gallium Nitride (GaN) based enhancement HEMTs.

5. The circuit of claim 1, wherein the shunt transistor comprises a Gallium Nitride (GaN) based enhancement HEMT.

6. The circuit of claim 1, wherein the first and second switching transistors comprise Gallium Nitride (GaN) based enhancement HEMTs.

7. The circuit of claim 1, wherein:
the gate of the first switching transistor is coupled to the first node; and
the gate of the second switching transistor is coupled to the second node.

8. The circuit of claim 1, wherein:
the gate of the first switching transistor is coupled between a first clamping element and a second clamping element of the first series of one or more clamping elements; and
the gate of the second switching transistor is coupled between a first clamping element and a second clamping element of the second series of one or more clamping elements.

9. A circuit comprising:
a switching shunt sub-circuit coupled between a first and second node, wherein the switching shunt sub-circuit is configured to short the first and second nodes together when a potential at a third node raises above a predetermined level;
a first clamping sub-circuit;
a first switching sub-circuit and a first resistive sub-circuit coupled in series, wherein the first switching sub-circuit is configured to couple the first resistive sub-circuit to the first clamping sub-circuit when a potential at the first node is above a potential of the second node, wherein the third node is biased at a first given potential drop below the potential on the first node by the first clamping sub-circuit when the potential at the first node is above the potential at the second node;
a second clamping sub-circuit; and
a second switching sub-circuit and a second resistive sub-circuit coupled in series, wherein the second switching sub-circuit is configured to couple the second resistive sub-circuit to the second clamping sub-circuit when the potential at the second node is above the potential of the first node, wherein the third node is biased at a second given potential drop below the potential on the second node by the second clamping sub-circuit when the potential at the second node is above the potential of the first node.

10. The circuit of claim 9, wherein the switching shunt sub-circuit comprises a first High Electron Mobility Transistor (HEMT) including a drain coupled to the first node, a source coupled to the second node, and a gate coupled to the third node.

11. The circuit of claim 10, wherein:
the first clamping sub-circuit comprises a first stack of a plurality of diode-coupled HEMTs; and
the second clamping sub-circuit comprises a second stack of a plurality of diode-coupled HEMTs.

12. The circuit of claim 11, wherein:
the first switching sub-circuit comprises a first HEMT including a drain coupled to the third node, a source coupled to the first resistive sub-circuit, and a gate coupled to the first node or between diode-coupled HEMTs of the first stack; and
the second switching sub-circuit comprises a second HEMT including a drain coupled to the second node, a source coupled to the second resistive sub-circuit, and a gate coupled to the second node or between diode-coupled HEMTs of the second stack.

13. The circuit of claim 12, wherein the predetermined level is substantially equal to a sum of threshold voltages of the first stack of diode-coupled HEMTs and the threshold of the first HEMT when the potential at the first node is above the second node, or a sum of threshold voltages of the second stack of diode-coupled HEMTs and the threshold of the second HEMT when the potential at the second node is above the first node.

14. A circuit comprising:
   a component coupled between a first and second node;
   a first transistor including a drain coupled to the first node, a source coupled to the second node and a gate coupled to a third node;
   a first series of clamping elements coupled in series between the first node and the third node;
   a second transistor including a drain coupled to the third node and a gate coupled along the first series of clamping elements not including the third node;
   a first resistive element coupled between a source of the second transistor and the second node;
   a second series of clamping elements coupled in series between the second node and the third node;
   a third transistor including a drain coupled to the third node and a gate coupled along the second series of clamping elements not including the third node;
   a second resistive element coupled between a source of the third transistor and the first node.

15. The circuit of claim 14, wherein the component comprises a High Electron Mobility Transistor (HEMT).

16. The circuit of claim 15, wherein the first and second series of clamping elements comprises first and second series of diode-coupled HEMTs.

17. The circuit of claim 16, wherein the first, second and third transistors comprise HEMTs.

18. The circuit of claim 17, wherein a monolithic integrated circuit includes the component, the first, second and third transistors, and the first and second series of diode elements.

19. The circuit of claim 14, wherein the first transistor is configured to short the first and second terminals together when a potential on the third node raises above a predetermined level with respect to the second terminal and the potential on the first terminal is greater than the potential on the second terminal, or when a potential on the third node raises above the predetermined level with respect to the first terminal and the potential on the second terminal is greater than the potential on the first terminal.

20. The circuit of claim 14, wherein the second and third transistors prevent the occurrence of a current path through the first and second resistive elements at the same time.

* * * * *